United States Patent [19]

Silvernail et al.

[11] Patent Number: 4,691,722
[45] Date of Patent: Sep. 8, 1987

[54] BOWL FOR LIQUID SPRAY PROCESSING MACHINE

[75] Inventors: James M. Silvernail, Maple Plain; Clifford C. Miller, Bloomington, both of Minn.

[73] Assignee: FSI Corporation, Chaska, Minn.

[21] Appl. No.: 636,724

[22] Filed: Aug. 1, 1984

[51] Int. Cl.⁴ .............................................. B08B 3/02
[52] U.S. Cl. ................................... 134/155; 134/149; 134/182; 134/200
[58] Field of Search ................ 134/64 R, 122 R, 199, 134/60, 96, 114, 137, 140, 149, 151, 155, 186, 132, 153, 154, 157, 182, 200, 175, 191, 190; 277/74, 57, DIG. 8; 137/590; 68/208

[56] References Cited

U.S. PATENT DOCUMENTS

| | | | |
|---|---|---|---|
| 1,301,055 | 4/1919 | Humberger | 68/208 |
| 1,574,452 | 2/1926 | South | 134/138 |
| 1,779,700 | 10/1930 | Grotberg | 68/208 |
| 2,331,700 | 10/1943 | Kirby | 68/208 X |
| 2,685,075 | 7/1954 | Mol | 134/199 X |
| 2,700,978 | 2/1955 | Pietsch | 134/186 |
| 3,138,946 | 6/1964 | Amthor, Jr. et al. | 68/208 X |
| 3,422,828 | 1/1969 | Dommer | 134/138 |
| 3,731,697 | 5/1973 | Yost | 134/138 |
| 3,919,865 | 11/1975 | Glandfield | 68/208 |
| 4,130,124 | 12/1978 | Sherwin | 134/138 |
| 4,197,000 | 4/1980 | Blackwood | 134/140 X |

FOREIGN PATENT DOCUMENTS 917468 7/1954 Fed. Rep. of Germany ...... 134/186
55-86963 7/1980 Japan ................................. 277/57

Primary Examiner—Harvey C. Hornsby
Assistant Examiner—Frankie L. Stinson
Attorney, Agent, or Firm—Palmatier & Sjoquist

[57] ABSTRACT

A spray processing machine for processing silicon wafers in the manufacture of integrated circuit chips the bowl defining the processing chamber being formed of molded plastic of a type which is highly inert to the deteriorating effects of highly active chemicals such as hydrochloric and hydrofluoric acid and similar highly active chemicals. The molded bowl has upright side walls with a cylindrical configuration and flat areas on the inner periphery to accommodate mounting spray posts on an upright position. The molded plastic housing also has a base wall which is peripherally downwardly spiraling configuration toward the drain port and from the highest portion of the base wall, also immediately adjacent the drain port; there being a step in the base wall defining a riser face facing opposite to the direction of the slope of the base wall and also facing opposite to the direction of rotation of the rotor in the processing chamber which carriers the wafers being processed. The base wall of the molded housing also defining integrally therewith, a rinsing water spray port to spray water against the bottom side of the turntable; and integrally formed an annular ribs spaced from each other concentric of the rotation axis to act with similar ribs on the turntable to define a labyrinth against flow of liquids inwardly toward the centrally disposed shaft.

6 Claims, 8 Drawing Figures

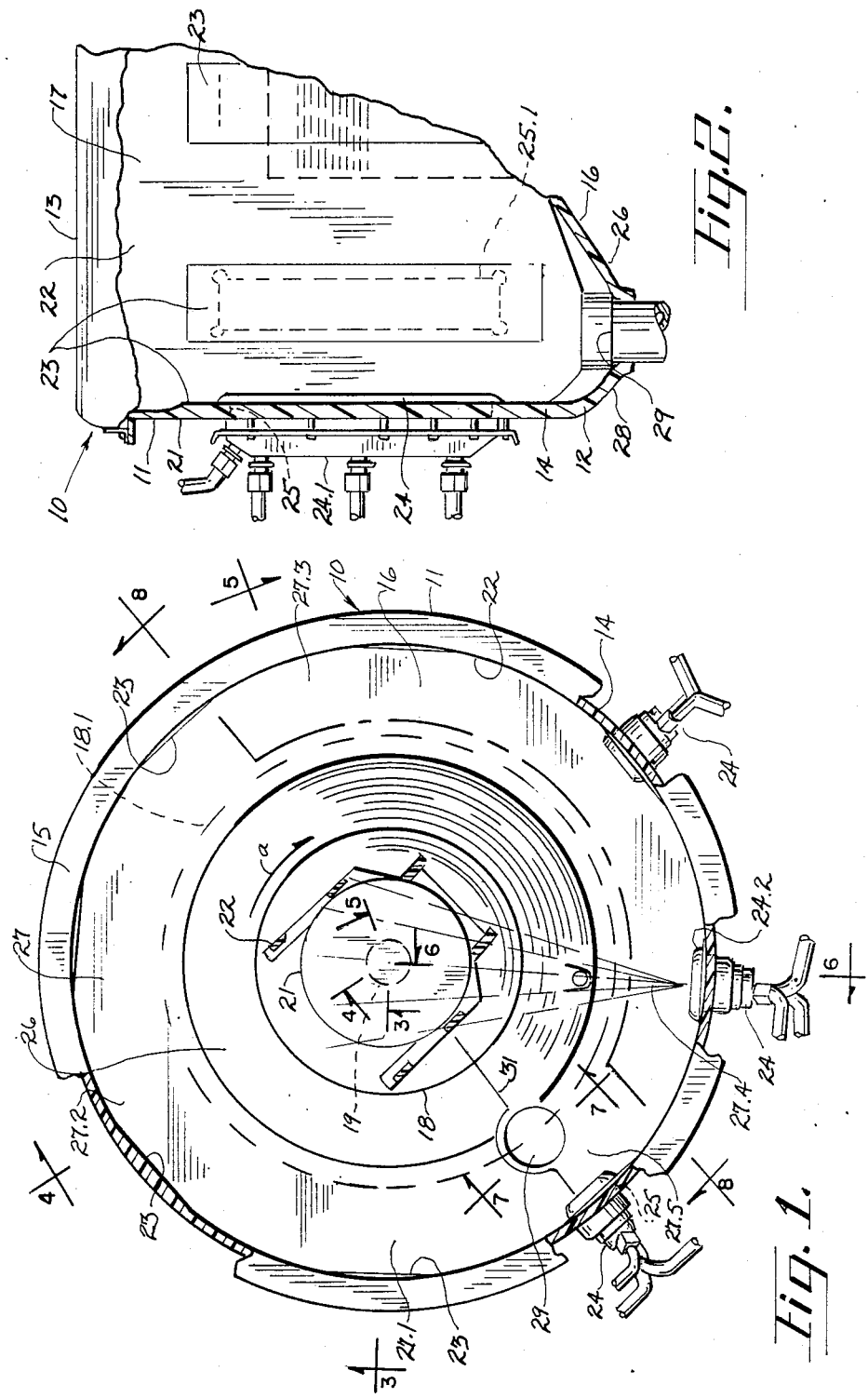

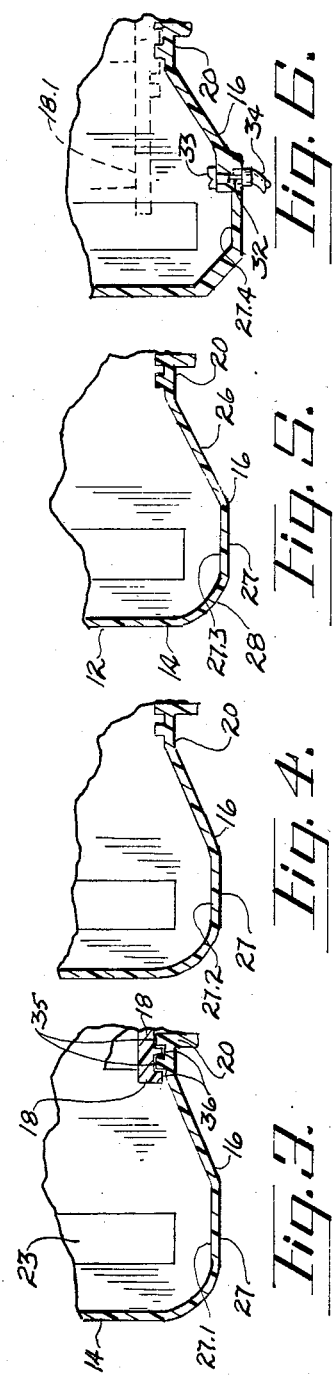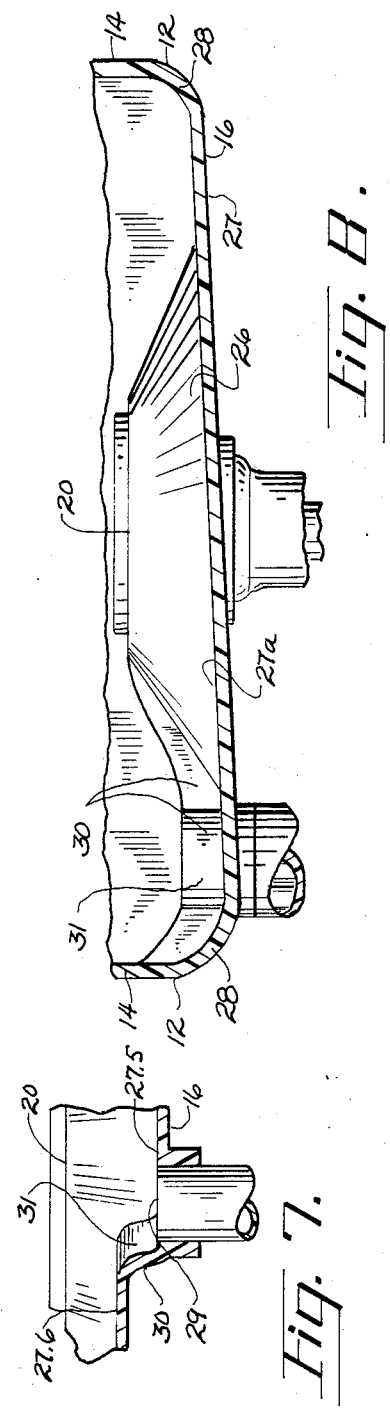

BOWL FOR LIQUID SPRAY PROCESSING MACHINE

BACKGROUND OF THE INVENTION

This invention relates to a machine for liquid spray processing of substrates or wafers in the manufacture of electronic devices or integrated circuit chips, and more particularly to the housing or bowl defining the chamber wherein such substrates are processed.

The housing or bowl for such a machine has a hinged cover as to tightly close the processing chamber, allowing access to the substrates being processed. A turntable in the bowl mounts a multiplicity of substrates being processed. The turntable may mount a single carrier of substrates at the rotation axis, or may mount a number of carriers at the periphery of the turntable. The turntable is driven by a shaft of which extends through the base wall of the bowl, opposite the cover.

Spray nozzles or spray posts in the bowl direct sprays of various processing liquids and gases, in a sequence of processing steps, onto the substrates or wafers being processed. Such spray nozzles or posts may be located at the outer peripheral bowl wall to direct sprays inwardly and onto the revolving substrates. Alternatively, the spray nozzles or post may be located centrally of the bowl to direct spray outwardly onto the substrates carried on the periphery of the turntable and revolving about the nozzles or spray posts.

Previously, the chamber defining housings or bowls have been made of stainless steel. Such bowls are illustrated in prior U.S. Pat. Nos. 3,990,462; 4,132,567 and 4,197,000. Because of the method of forming such stainless steel bowls, these bowls have been limited in the shape and therefore in the function that could be accomplished by the bowl without attachments. In addition, stainless steel has limitations in its ability to withstand the deteriorating effect of highly active processing chemicals, which include hydrofluoric acid, hydrochloric acid, sulfuric acid, hydrogen peroxide and similar highly active acids.

SUMMARY OF THE INVENTION

An object of the invention is to provide an improved processing chamber defining bowl for a substrate spray processing machine to obtain additional functions not possible with known prior art bowls.

A feature of the improved bowl is the molded construction of the bowl, of an inert plastic which is highly resistant to the deteriorating effect of the highly active chemicals used in the processing of substrates into electronic devices. The molded bowl is substantially cylindrical and smoothly contoured at its periphery, but has a multiplicity of elongate upright flat faces spaced about its inner periphery to accommodate mounting of spray posts in the bowl wall.

The base wall of the bowl, opposite the cover, is sloped in a peripheral direction and is substantially spirally shaped. The lowest portion of the spiral base wall is at the drain port in the base wall.

The base wall also has a smoothly rounded, but distinct step adjacent the drain port as to define the highest portion of the base wall adjacent the drain port. The substantially upright riser face of the step in the base wall substantially prevents the flow of draining liquids upwardly over the step, and accordingly assures that the liquids will be directed into the drain port. The downward slope of the spiral base wall has the same peripheral direction as the direction of rotation of the turntable in the bowl. As a result, the gaseous fluid turbulence in the chamber, induced by rotation of the turntable adjacent the base wall, assists and contributes to the flow of draining liquids on the spiral base wall toward the drain port.

The base wall of the molded bowl is also sloped in an outward direction from the central hub of the base wall and toward the outer periphery of the base wall so as to concentrate the flow of draining liquids directly toward the drain port.

The base wall of the molded bowl also defines a rinsing water port for supplying rinsing water under pressure to spray and rinse the bottom face of the turntable. The base wall of the bowl has a plurality of axially protruding annular ribs concentric of the turntable rotation axis for cooperation with similar annular and concentric ribs on the turntable or rotor and projecting axially in the opposite direction for defining a labyrinth seal to minimize any possible migration of sprays from the wall mounted spray post inwardly toward the shaft of which mounts and rotates the turntable.

The molded bowl provides several advantages in that the spirally configured based wall causes collected liquids to drain immediately toward the drain port, and causes such draining liquids to immediately pass through the port because there is no place for draining liquids to collect on the base wall of the bowl. The step in the base wall adjacent the drain port faces in a direction opposite to the direction of rotation of the turntable to prevent any flow of draining liquids past the drain port and to also locate the highest portion of the base wall immediately adjacent the drain port, thereby assuring continued sloped drainage entirely around the periphery of the base wall from the top of the step to the drain port which is immediately below the step.

The rinsing water spray port in the base wall directs spray onto the bottom side of the turntable for assuring cleaning of the turntable between the steps of applying highly active chemicals into the processing chamber.

BRIEF DESCRIPTION OF DRAWINGS

FIG. 1 is a top plan view into the spray processing machine with a cover removed;

FIG. 2 is a detailed section view of the processing machine at approximately 2—2 of FIG. 1, but with the wafers and carrier illustrated in dotted lines;

FIGS. 3, 4, 5 and 6 illustrate the varying shape of the spiraling base wall of the bowl and more specifically, FIG. 3 is a detailed section view taken approximately at 3—3 in FIG. 1;

FIG. 4 is a detail section view taken approximately at 4—4 in FIG. 1;

FIG. 5 is a detail section view taken approximately at 5—5 in FIG. 1;

FIG. 6 is a detail section view taken approximately at 6—6 in FIG. 1;

FIG. 7 is a detail section view taken at 7—7 in FIG. 1; and

FIG. 8 is a detail section illustrating the spirally shaped base wall of the bowl and is taken along a broken line as indicated at 8—8 in FIG. 1.

DETAILED SPECIFICATION

One form of the invention is illustrated in the drawings and is descibed herein, and certain variations are illustrated.

The spray processing machine is indicated in general by numeral 10 and includes a housing 11 made up of a substantially cylindrical bowl 12 and a cover 13 hinged to the bowl. The bowl 12 has a upright and generally cylindrical side wall 14 with an outturned flange 15 at its upper periphery. The bowl 12 also includes a base wall 16. The housing, including the bowl 12 and cover 13 encloses the central processing chamber 17.

A rotor in the chamber 17 includes a turntable 18 and shaft 19, which supports and rotates the turntable, extends outwardly through the central portion 20 of the base wall 16. The turntable 18 carries and revolves a multiplicity of substrates or silicon wafers 21 which are confined in a carrier 22 removably affixed on the turntable so that the circular wafers 21 are located substantially concentrically of and normal to the rotation axis of the turntable. The turntable 18 and shaft 19 are revolved in the direction of the arrow A at varying speeds, depending upon the particular step which is being carried out in processing the wafers or substrates 21, and the speeds may vary as low as 50 r.p.m. up to 1,000 r.p.m. or 2,000 r.p.m.

The bowl 12 is molded of plastic of a type which is highly inert to the deteriorating effects of the highly active chemicals used in the spray processing of the wafers 21, and preferably of the bowl 12 is molded of one of the fluoropolymer plastics known by the trademark Teflon, owned by the E.I. DuPont DeNemours Company, Wilmington, Del. Teflon materials are typically perfluoroalkoxy and tetrafluoroethylenepolymers. Other similar plastics also highly resistive to the deteriorating effect of highly active chemicals are also available. The extremely active chemicals used in the spray processing include such chemicals as hydrofluoric acid, hydrochloric acid, sulfuric acid, hydrogen peroxide, ammonium nitrate and others as well as rinsing waters and inert gases such as nitrogen and argon. The turntable 18 is similarly made of such plastics or of metal coated with such plastics which are highly resistant or substantially inert to the deteriorating effects of the highly active chemicals used in the spray processing.

The peripheral side wall 14 of the bowl 12 has a substantially circular and cylindrical outer surface 21. The inner surface 22 of the bowl 12 is smoothly contoured, and is generally cylindrical but has a plurality of elongate upright flat surfaced areas 23 spaced all about the periphery of the inner surface 22. It will be seen in FIG. 2 that the flat surfaces 23 extend throughout substantially the entire height of the side wall 14 and the flat surfaces 23 are oriented to confront the turntable and rotation axis which is substantially concentric of the generally cylindrical side wall 14.

In the particular bowl 12 illustrated, the peripheral side wall has eight such flat faces 23 spaced about the periphery.

The flat faces are especially useful in mounting elongate spray posts 24, the bodies 24.1 of which protrude through openings 25 in the side wall at certain of the flat faces 23 as illustrated.

An opening 25 through the peripheral side wall 14 at a flat face 23 must have the approximate shape as indicated by the dotted lines 25.1 seen in FIG. 2. Each of the nozzles 24 have a front lip or flange 24.2 which bears against the flat face 23 of the bowl side wall adjacently opening 25 for sealing the spray post in the side wall. Spray post 24 have multiple passages and multiple orifices facing inwardly of the chamber 17 to direct processing chemicals, rinsing water, and nitrogen gas into the processing chamber and onto the wafers at varying steps in the processing of the wafers.

It will been seen in FIG. 1 that the use of multiple spray post 24 adjacent each other, but spaced from each other about the periphery of the bowl side wall 14 is useful in assuring that the chemicals are thoroughly mixed with each other as they are sprayed across the wafers.

The base wall 16 of the molded bowl 12 has a flat central portion 20, a tapered or flared portion 26 and a generally flat drainage area 27 adjacent the smoothly rounded periphery 28 which joins the side wall 14. The base wall 16 has a drain port 29 therein and approximately centered in the flat drainage area of the bottom wall. The flat drainage area 27 of the bottom wall is sloped peripherally downwardly all around the periphery of the bowl in a spiraling configuration toward the drain port 29. The upper drain surface 27a of the drainage area 27 is smooth and unobstructed and follows the spiraling configuration of the drainage area 27.

In all of FIGS. 3-7, the elevation of the central portion 20 of the base wall 16 is uniform. The upper drain surface areas designated 27.1, 27.2, 27.3, 27.4, and 27.5, are progressively lower with respect to the central portion 20 of the base wall 16 because of the downwardly spiraling configuration of the flat drainage area 27 of the base wall.

The lowest portion of the top surface of the base wall is designated 27.5, immediately adjacent the drain port 29. Also, the portion of the upper drain surface which has the highest elevation is designated 27.6 and is also immediately adjacent the drain port 29 as seen in FIGS. 1 and 7.

The base wall 16 defines a step 30 between the drain port 29 and the highest portion 27.6 of the drain surface of the base wall. The step is an abrupt change in the contour of the base wall 16 and transverses the base wall entirely from the central portion 20 through the outer peripheral wall 14.

The step 30 defines a substantially upright riser face 31 which confronts the drain port 29 and which also faces peripherally of the base wall 16 in a direction opposite to the direction of rotation of the turntable as indicated by arrow. Accordingly, the riser face 31 and step 30 present an obstruction to liquids moving along the slope and spirally configured drainage area 27 and propelled along by the moving gaseous fluids in the chamber influenced by the revolving turntable 21 and carrier 22. It will be recognized in comparing FIGS. 3, 4, 5 and 6, that the tapered or flared portion 26 of the base wall 16 is progressively sloped more steeply and of course the liquids which are collected thereon will drain immediately to the spirally configured drainage area 27 of the base wall 16.

As seen in FIG. 6, the base wall 16 has a rinsing water spray port 32 which is vertically oriented and adapted to receive the spray nozzle 33 therein for connection to a source of rinsing water in the tube 34 connected to the port 32. The spray port 32 and nozzle 33 confront the bottom of the turntable for spraying rinse water onto the bottom of the turntable.

The central portion 20 of the base wall has a pair of spaced annular ribs 35 protruding axially of the shaft 19, and arranged concentrically of shaft 19 and formed integrally of the base wall 16. The ribs 35 interleave with another pair of spaced annular ribs 36 protruding axially from the turntable 18 and concentrically of the shaft 19 for forming a labyrinth seal between the housing and the turntable for minimizing any possible flow of moisture or liquids inwardly of the turntable and along the bottom wall to the shaft 19.

In FIG. 6 an alternate shape of turntable indicated by numeral 18.1, the periphery of which is seen in dotted lines in FIG. 1. The alternate form of turntable 18.1 may mount the wafers adjacent the periphery of the turntable to revolve around the axis of rotation rather than being located on the axis of rotation. The rinsing water spray port 32 is particularly useful with the alternate larger form of turntable 18.1 for directing rinsing sprays onto the turntable during rinsing cycles of the processing of wafers.

It will be seen that the present invention provides an improved molded housing with a peripheral side wall having flat surface areas accommodating mounting of spray posts thereon which will lie flush against the flat areas 23 and are sealed thereto for spraying inwardly toward wafers revolving on the turntable. The molded housing also provides a sloped spiraling configured base wall draining collected liquids to the drain port. The highest portion of the base wall is also adjacently the drain port and the base wall slopes downwardly all the way around the periphery of the housing. The step between the drain port and the highest portion of the base wall obstructs a passage of the draining liquids past the drain port and assures that such draining liquids are diverted down through the drain port.

The spirally configured base wall slopes downwardly in the same peripheral direction which represent the direction of rotation of the turntable so that the revolving gaseous fluid in the processing chamber assists and contribute to the flow of the draining liquids along the slope and spirally base wall. The base wall also defines the rinsing water port and integrally formed annular ribs cooperating with similar ribs on the turntable to define the labyrinth seal.

What is claimed is:

1. A spray processing machine for confining and directing liquid sprays onto wafer substrates in the manufacture of electronic devices, comprising
   a bowl having an open top, a peripheral side wall and base wall opposite the open top,
   an openable cover cooperating with the bowl in defining a processing chamber,
   rotor means in the bowl for mounting such wafer substrates and revolving the substrates,
   means spraying liquid sprays into the bowl and onto the wafer substrates therein,
   the base wall having an open drain port and having an upper drain surface being sloped peripherally downwardly in a spiraling configuration spray liquids toward the drain port, the flow of collected spray liquids toward the drain port, the peripheral direction of rotation of the rotor being the same as the peripheral direction of downward slope of the spiraling configuration, the base wall also having a step adjacent the drain port, the step defining a riser face, facing in a direction opposite to the rotation of the rotor, whereby the gaseous fluid turbulence induced in the processing chamber by revolving of the rotor assists and contributes to the flow of draining liquids downwardly along the spiraling configuration on the base wall until obstructed by the riser face of the step for rapid delivery into the drain port.

2. A spray processing machine according to claim 1 wherein said riser face is substantially upright.

3. A spray processing machine according to claim 1 wherein the bowl is made of plastic which is highly inert to the deteriorating effects of highly active liquid chemicals being sprayed onto such wafer substrates.

4. A spray processing machine according to claim 1 and the highest portion of the upper drain surface being adjacent the drain port and above the step.

5. A spray processing machine according to claim 1 and the rotor including a turntable overlying and confronting a portion of the base wall, and a rinsing water spray port in the base wall and directing rinsing water against the turntable.

6. A spray processing machine according to claim 1 in the peripheral side wall of the bowl has a smoothly contoured interior surface with a multiplicity of substantially flat surface portions facing the rotor, and a spray post mounted on the peripheral wall and bearing against one of the said portions of the inner peripheral surface.

* * * * *

UNITED STATES PATENT AND TRADEMARK OFFICE
CERTIFICATE OF CORRECTION

PATENT NO. : 4,691,722

DATED : September 8, 1987

INVENTOR(S) : James M. Silvernail, Clifford C. Miller

It is certified that error appears in the above-identified patent and that said Letters Patent is hereby corrected as shown below:

Column 4, line 44, delete "arrow" and insert --arrow a--.

Claim 1, column 6, line 9, after "configuration" and before "spray", insert --toward the drain port and causing the flow of collected--.

Signed and Sealed this

Fifth Day of April, 1988

Attest:

DONALD J. QUIGG

Attesting Officer

Commissioner of Patents and Trademarks